United States Patent
Li et al.

(10) Patent No.: US 6,797,628 B2
(45) Date of Patent: Sep. 28, 2004

(54) METHODS OF FORMING INTEGRATED CIRCUITRY, SEMICONDUCTOR PROCESSING METHODS, AND PROCESSING METHOD OF FORMING MRAM CIRCUITRY

(75) Inventors: Li Li, Meridian, ID (US); Max F. Hineman, Boise, ID (US); Mark E. Tuttle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 8 days.

(21) Appl. No.: 10/051,678

(22) Filed: Jan. 16, 2002

(65) Prior Publication Data

US 2003/0134513 A1 Jul. 17, 2003

(51) Int. Cl.[7] .................. H01L 21/302; H01L 21/461
(52) U.S. Cl. .................. 438/694; 438/702; 438/703; 438/725; 438/734
(58) Field of Search .................. 438/167, 438, 438/723, 728, 738, 740, 268, 267, 702, 780, 905, 689, 734

(56) References Cited

U.S. PATENT DOCUMENTS

| | | | | |
|---|---|---|---|---|
| 4,861,533 A | * | 8/1989 | Bertin et al. ............... 264/81 |
| 5,070,027 A | * | 12/1991 | Mito et al. .................. 438/483 |
| 5,116,462 A | * | 5/1992 | Bartha et al. ................. 216/2 |
| 5,135,885 A | * | 8/1992 | Furukawa et al. .......... 438/167 |
| 5,296,258 A | * | 3/1994 | Tay et al. .................... 427/96 |
| 5,335,256 A | * | 8/1994 | Maruyama et al. .......... 378/35 |
| 5,466,617 A | * | 11/1995 | Shannon ..................... 438/155 |
| 5,965,463 A | * | 10/1999 | Cui et al. ................... 438/723 |
| 6,064,081 A | * | 5/2000 | Robinson et al. .......... 257/183 |
| 6,273,950 B1 | * | 8/2001 | Kitabatake .................. 117/95 |
| 6,340,435 B1 | * | 1/2002 | Bjorkman et al. ........... 216/72 |
| 6,387,551 B1 | * | 5/2002 | Nishioka et al. ........... 428/698 |
| 6,569,257 B1 | * | 5/2003 | Nguyen et al. ............. 134/26 |
| 6,599,814 B1 | * | 7/2003 | Vanhaelemeersch et al. ..... 438/431 |

* cited by examiner

*Primary Examiner*—Michael Lebentritt
(74) *Attorney, Agent, or Firm*—Wells St. John P.S.

(57) ABSTRACT

A method of forming integrated circuitry includes chemical vapor depositing a silicon carbide comprising layer over a substrate at a temperature of no greater than 500° C. Plasma etching is conducted through at least a portion of the silicon carbide comprising layer using a gas chemistry comprising oxygen and hydrogen. Semiconductor processing methods include the above in fabrication of contact openings and in fabrication of MRAM circuitry. Semiconductor processing methods also include fabrication of contact openings using resist and removing silicon carbide comprising material and resist in a common plasma etching step.

65 Claims, 5 Drawing Sheets

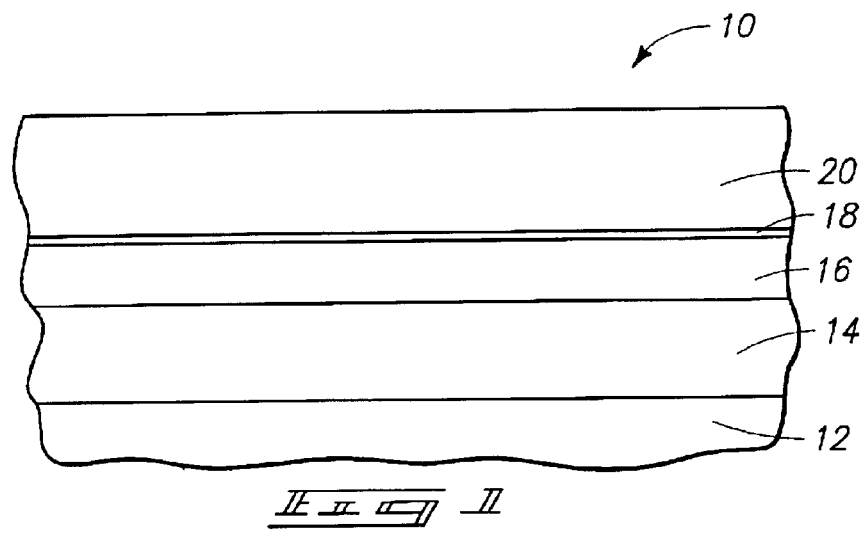
_Fig. 1_
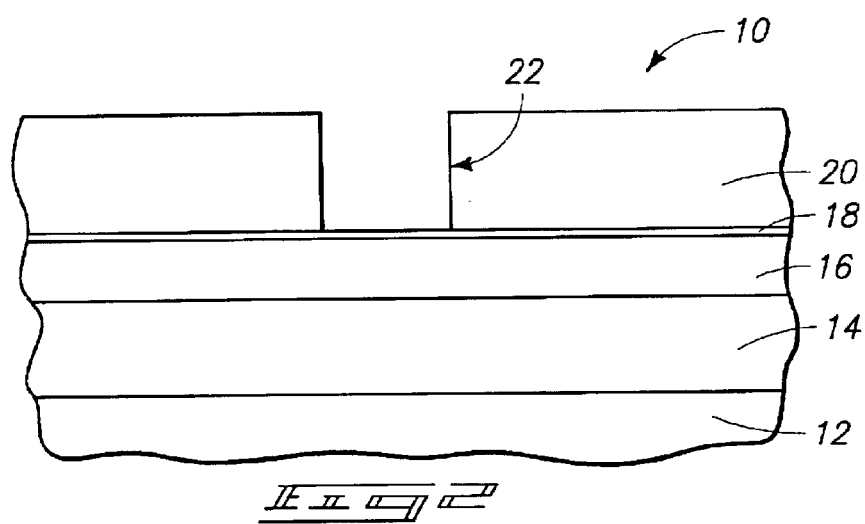
_Fig. 2_
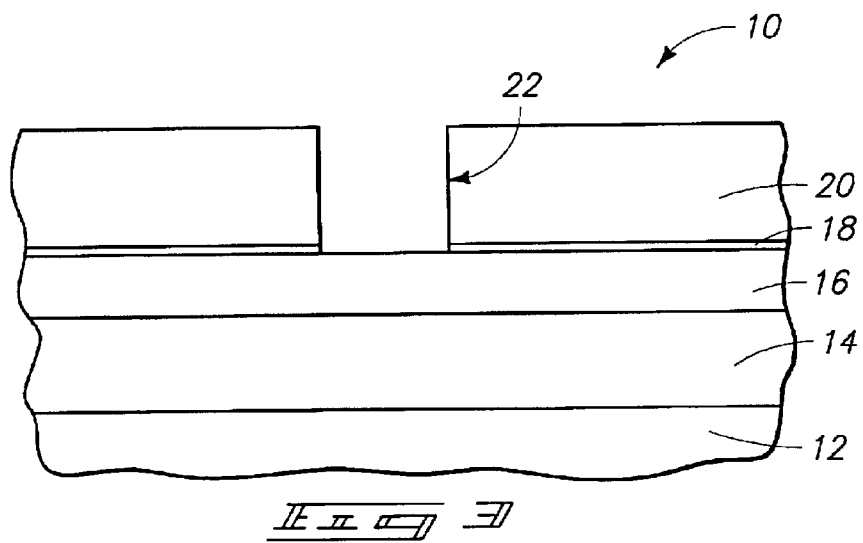
_Fig. 3_

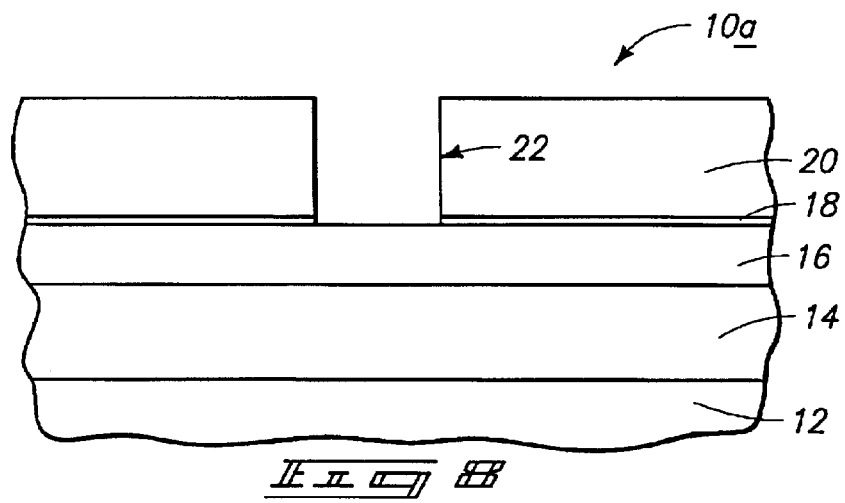
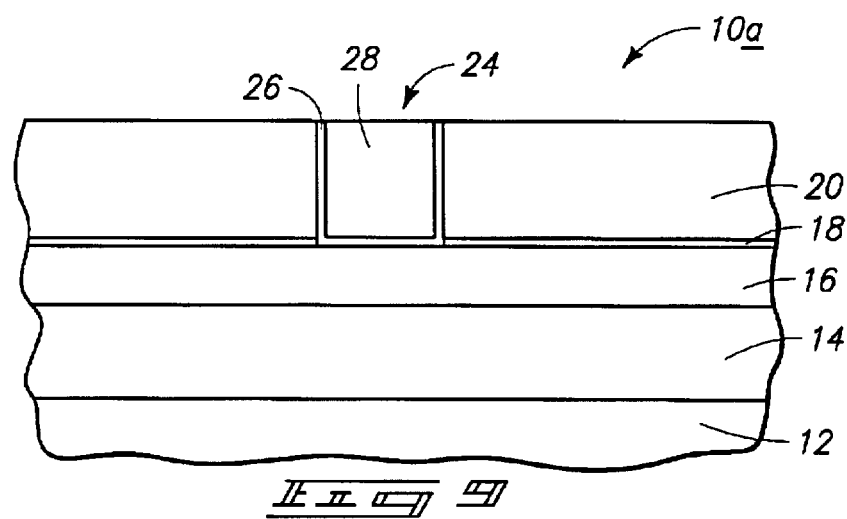
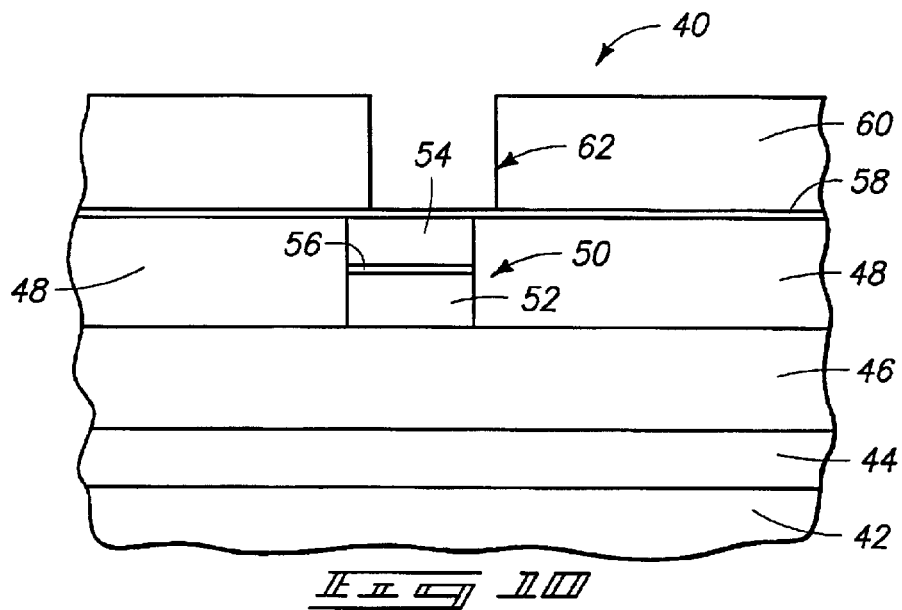

METHODS OF FORMING INTEGRATED CIRCUITRY, SEMICONDUCTOR PROCESSING METHODS, AND PROCESSING METHOD OF FORMING MRAM CIRCUITRY

TECHNICAL FIELD

This invention relates to methods of forming integrated circuitry, to semiconductor processing methods, and to processing methods of forming MRAM circuitry.

BACKGROUND OF THE INVENTION

Semiconductor wafer processing in the fabrication of integrated circuitry typically includes the formation of contact openings within insulating layers to underlying conductive structures. Currently, such processing is typically conducted by photolithography wherein a masking layer is deposited and a desired pattern of openings is formed therethrough. The masking layer is then used as a mask while chemical etching is conducted through the mask openings into the underlying insulative material to etch it largely selective to the masking layer such that the openings can be extended through the insulating material to the conductive structures therebeneath.

In some applications, the underlying insulative material can be thicker on some portions of the die than on other portions. This can create problems in the etch of the contact openings as the material underlying the insulative material will be exposed to the etching conditions longer where the insulative material is thinnest as compared to where such is thickest. In such instances, it might be desirable to use a thin etch stop layer as the lowestmost portion of the insulative material. Then, an etch chemistry is selected which will essentially stop on the etch stop material layer. Accordingly, etch stop material remaining over the material where a contact is desired will be of roughly the same thickness across the die. The etch stop material is subsequently removed. Silicon carbide is one such material. However, such material typically is very tenaciously adhered to the substrate in part due to its exposure to high temperatures to which the substrate is typically exposed during subsequent processing prior to the time of its desired removal. While this is good from its functioning as an etch stop layer, it is not so good when it comes time to remove it from the substrate. Presently, such is removed by a rather nonselective primarily physical sputtering action using a combination of $NF_3$, $Cl_2$ and Ar as opposed to by chemical action.

The following invention was motivated in addressing the above identified problems, although the invention is in no way so limited. The invention is limited only by the accompanying claims as literally worded without limiting reference to the specification, and in accordance with the doctrine of equivalence.

SUMMARY

The invention includes methods of forming integrated circuitry, semiconductor processing methods, and processing methods of forming MRAM circuitry. In one implementation, a method of forming integrated circuitry includes chemical vapor depositing a silicon carbide comprising layer over a substrate at a temperature of no greater than 500° C. Plasma etching is conducted through at least a portion of the silicon carbide comprising layer using a gas chemistry comprising oxygen and hydrogen.

In one implementation, a semiconductor processing method includes chemical vapor depositing a silicon carbide comprising layer over a semiconductor substrate at a temperature of no greater than 500° C. An insulative material is formed over the silicon carbide comprising layer. A contact opening is etched through the insulative material to proximate the silicon carbide comprising layer. Plasma etching is conducted within the contact opening through the silicon carbide comprising layer using a gas chemistry comprising oxygen and hydrogen to extend the contact opening through the silicon carbide comprising layer and under conditions which etches the silicon carbide comprising layer at a rate at least twice that of any etching of the insulative material.

In one implementation, a process of forming MRAM circuitry includes forming an MRAM cell comprising magnetic material over a substrate. A silicon carbide comprising layer is chemical vapor deposited over the MRAM cell at a temperature of no greater than 500° C. An insulative material is formed over the silicon carbide comprising layer. A contact opening is etched through the insulative material using the silicon carbide comprising layer as an etch stop. Plasma etching is conducted within the contact opening through the silicon carbide comprising layer using a gas chemistry comprising oxygen and hydrogen to extend the contact opening through the silicon carbide comprising layer to the magnetic material of the MRAM cell, and under conditions which etches the silicon carbide comprising layer at a rate at least twice that of any etching of the insulative material.

In one implementation, a semiconductor processing method includes chemical vapor depositing a silicon carbide comprising layer over a semiconductor substrate at a temperature of no greater than 500° C. An insulative material is formed over the silicon carbide comprising layer. Resist is formed over the insulative material. A mask opening is formed within the resist to proximate the insulative layer. A contact opening is etched through the insulative material through the mask opening to proximate the silicon carbide comprising layer. In a common etching step and with the resist on the substrate, a) plasma etching is conducted within the contact opening through the silicon carbide comprising layer using a gas chemistry comprising oxygen and hydrogen to extend the contact opening through the silicon carbide comprising layer and under conditions which etch the silicon carbide comprising layer at a rate at least twice that of any etching of the insulative material, and b) plasma etching of all resist from the substrate is conducted.

BRIEF DESCRIPTION OF THE DRAWINGS

Preferred embodiments of the invention are described below with reference to the following accompanying drawings.

FIG. 1 is a diagrammatic sectional view of a semiconductor wafer fragment/section in process in accordance with an aspect of the invention.

FIG. 2 is a view of the FIG. 1 wafer fragment at a processing step subsequent to that shown by FIG. 1.

FIG. 3 is a view of the FIG. 2 wafer fragment at a processing step subsequent to that shown by FIG. 2.

FIG. 8 is a view of the FIG. 7 wafer fragment at a processing step subsequent to that shown by FIG. 7.

FIG. 9 is a view of the FIG. 8 wafer fragment at a processing step subsequent to that shown by FIG. 8.

FIG. 10 is a diagrammatic sectional view of another alternate embodiment semiconductor wafer fragment/section in process in accordance with an aspect of the invention.

DETAILED DESCRIPTION OF THE PREFERRED EMBODIMENTS

Figure 4:
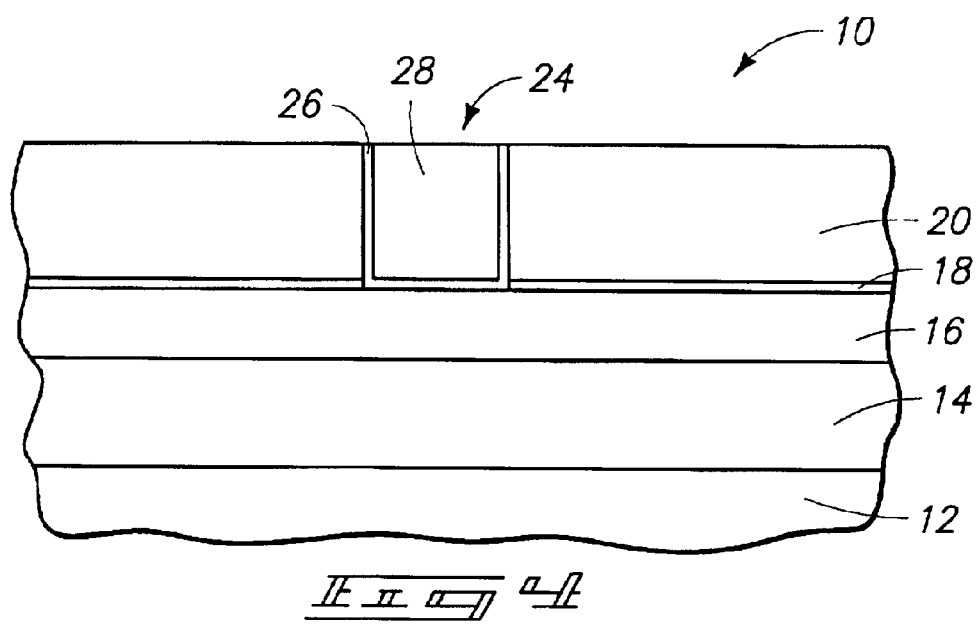
FIG. 4 is a view of the FIG. 3 wafer fragment at a processing step subsequent to that shown by FIG. 3.

This disclosure of the invention is submitted in furtherance of the constitutional purposes of the U.S. Patent Laws "to promote the progress of science and useful arts" (Article 1, Section 8).

One exemplary preferred embodiment of a method of forming integrated circuitry is initially described with reference to FIGS. 1–4. FIG. 1 depicts a wafer fragment 10 comprising a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated.

An insulative layer 14 is formed over bulk substrate 12, with doped or undoped silicon dioxide and silicon nitride being exemplary materials. A conductive layer 16 is formed over insulative material 14. Exemplary preferred materials include conductive elemental metal, conductive metals and conductive metal compounds. Further by way of example only, conductively doped semiconductive material, such as polysilicon, are possible materials also.

A silicon carbide comprising layer 18 is chemical vapor deposited over the substrate at a temperature of no greater than 500° C. Such depositing can be conducted with or without plasma enhancement, whether direct within the chamber or remotely generated external of the chamber. Preferably, the chemical vapor depositing is conducted at a temperature of no greater than 250° C., and even more preferably at a temperature of no greater than 200° C. A specific preferred temperature range is from 150° C. to 200° C. An exemplary preferred plasma power is from 100 Watts to 800 Watts, with a preferred pressure range being from 2 Torr to 8 Torr. By way of example only, exemplary precursor gases for forming a silicon carbide layer 18 include trimethylsilane and helium at respective flow rates of from about 100–200 sccm and from about 300–500 sccm. A preferred thickness range for layer 18 is from 100 Angstroms to 1000 Angstroms, with 100 Angstroms being a specific preferred example.

An insulative material 20 is formed over silicon carbide comprising layer 18. Exemplary preferred materials include doped and undoped silicon dioxide, and silicon nitride, deposited by chemical vapor deposition, with or without plasma. But one exemplary deposition process for forming substantially undoped silicon dioxide includes plasma deposition using $SiH_4$, $N_2O$ and He as feed gases. Exemplary flow rates for such gasses are from 50 to 400 sccm, from 100 to 2000 sccm, and from 500 to 1500 sccm, respectively. Plasma is preferably utilized in the chamber, with an exemplary power range being from 100 Watts to 800 Watts. An exemplary temperature range is from 200° C. to 500° C., with an exemplary pressure range being from 2 Torr to 8 Torr.

Referring to FIG. 2, a contact opening 22 is etched into insulative material layer 20 to proximate silicon carbide comprising layer 18. Patterning or other processing to form the desired location for contact opening 22 could constitute photolithography, other lithography, laser ablation, or any other technique whether existing or yet-to-be-developed. As shown, such etching is preferably conducted entirely through insulative material 20 effective to expose silicon carbide comprising layer 18, and using silicon carbide comprising layer 18 as an etch stop during such etching. By way of example only, and where insulative material layer 20 constitutes undoped silicon dioxide, a suitable etching chemistry includes at least one fluorocarbon (i.e., $CF_4$, $CHF_3$, etc.) and an inert gas, for example He. Such is preferably conducted as a plasma etch in a suitable plasma etcher, and can include plasma etching with a remote generation of plasma. By way of example only, during the etch, an exemplary power range is from 100 Watts to 3000 Watts, an exemplary substrate temperature range is from 60° C. to 80° C., and an exemplary pressure range is from 1 mTorr to 300 mTorr.

Referring to FIG. 3, plasma etching is conducted within contact opening 22 through silicon carbide comprising layer 18 using a gas chemistry comprising oxygen and hydrogen. Such plasma etching is ideally conducted to extend contact opening 22 through silicon carbide comprising layer 18 and under conditions which etch silicon carbide comprising layer 18 at a rate at least twice that of any etching of insulative material 20, more preferably at a rate of at least three times that of any etching of insulative material 20, and even more preferably at a rate of at least four times that of any etching of insulative material 20. Oxygen in such plasma etching is preferably derived from any of $O_2$, $O_3$, $NO_x$, CO, $CO_2$ and mixtures thereof. Hydrogen in such plasma etching is preferably derived from any of $H_2$, $NH_3$, $CH_4$ and mixtures thereof. Exemplary preferred processing conditions include a substrate temperature from 60° C. to 80° C. and a pressure range from 1 mTorr to 300 mTorr. Direct plasma generation within the chamber is most preferably utilized with any suitable plasma apparatus (i.e., high density plasma, parallel plate, inductively coupled, etc.) being contemplated, whether existing or yet-to-be-developed. Remote plasma is also contemplated whereby the plasma during such etching is first formed remote from the chamber, but is less preferred due to the anticipated etching rate.

A reduction to practice example included etching a 100 Angstrom thick layer of silicon carbide in an Applied Materials 5000 capacitively coupled etching chamber. The substrate temperature was allowed to float, and as a result was maintained between 60° C. and 80° C. Power was 1000 Watts and pressure was 80 mTorr. Gases flowed to the chamber included $O_2$ at 50 sccm and $NH_3$ at 100 sccm. Complete etch through a 100 Angstrom thick layer consisting essentially of silicon carbide occurred in 30 seconds.

Selectivity in the etch of the silicon carbide relative to the insulative material was greater than 4:1. The above-described exemplary general chemistry employing oxygen and hydrogen and suitable other conditions is expected to provide selectivity of at least 2:1 in the etch of silicon carbide relative to any exposed oxides, nitrides, metals and metal compounds.

In one aspect of the invention, the substrate is ideally not exposed to a temperature greater than the highest temperature during the depositing of layer 18 between its depositing and the plasma etching. This is most preferred to prevent undesired subsequent high temperature processing which might adversely make the silicon carbide layer more tenaciously adhere to the underlying substrate, making more difficult its removal with the above-described general chemistry. In one implementation, the substrate is not exposed to a temperature greater than 500° C. between the depositing and the etching, and more preferably not exposed to a temperature greater than 250° C. between the depositing and the etching.

The above describes but one preferred method of forming integrated circuitry which includes chemical vapor depositing a silicon carbide comprising layer over a substrate at a temperature of no greater than 500° C., followed by plasma etching through at least a portion of the silicon carbide comprising layer using a gas chemistry comprising oxygen and hydrogen. Any other fabricated structure and method is contemplated in accordance with the issued claims as literally worded without limiting reference to the specification or drawings. For example and by way of example only, chemical vapor deposition and etching of an exposed silicon carbide comprising layer is contemplated independent of the receipt of insulative material thereover.

Referring to FIG. 4, conductive material 24 is formed within contact opening 22. By way of example only, exemplary preferred materials include a titanium nitride barrier layer 26 and an elemental tungsten 28.

Figure 5:
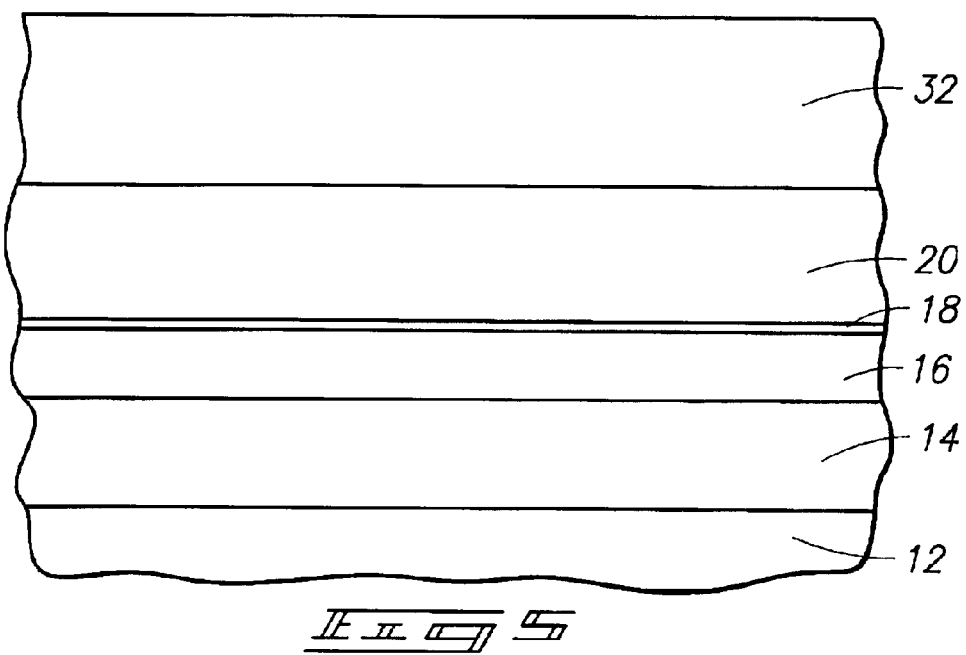
FIG. 5 is a diagrammatic sectional view of an alternate embodiment semiconductor wafer fragment/section in process in accordance with an aspect of the invention.

One preferred implementation in the fabrication of the FIG. 4 construction is described with reference to FIGS. 5–9. Like numerals from the first described embodiments are utilized where appropriate, with differences being indicated with the suffix "a" or with different numerals. FIG. 5 depicts an alternate embodiment wafer fragment 10a, the same as that of FIG. 1 with the addition of a resist 32 being formed over insulative material 20. Any conventional or yet-to-be-developed resist material could be utilized, with organic photoresist being but one example. An exemplary deposition thickness for resist 32 is 7600 Angstroms.

Figure 6:
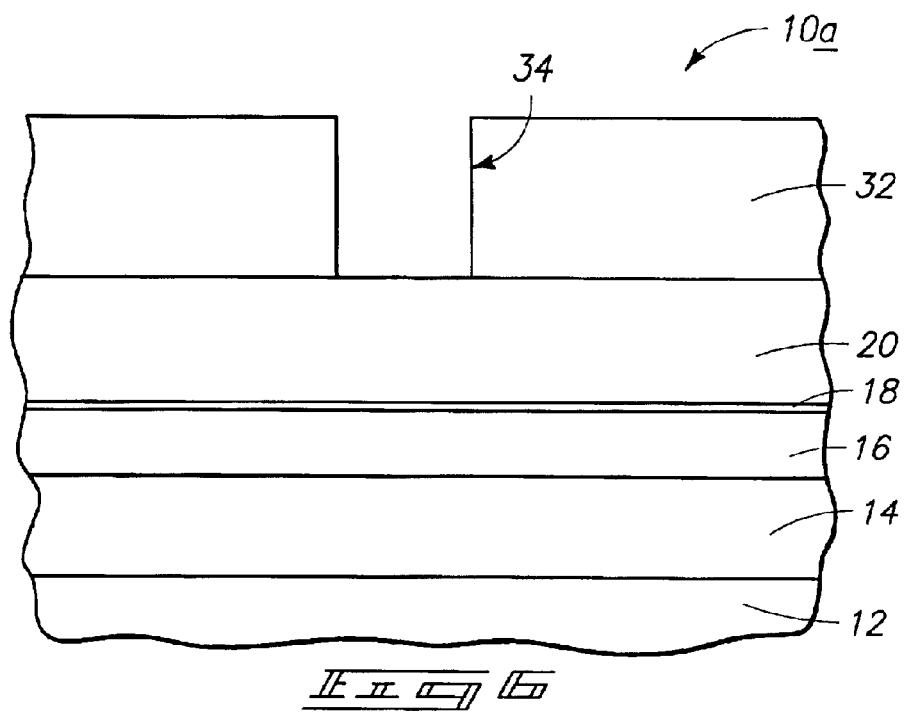
FIG. 6 is a view of the FIG. 5 wafer fragment at a processing step subsequent to that shown by FIG. 5.

Referring to FIG. 6, a mask opening 34 is formed within resist 32 to extend to proximate insulative material 20, and preferably all the way thereto as shown. By way of example only, such could be conducted by photolithography or e-beam lithography followed by solvent development, or any other existing or yet-to-be-developed technique.

Figure 7:
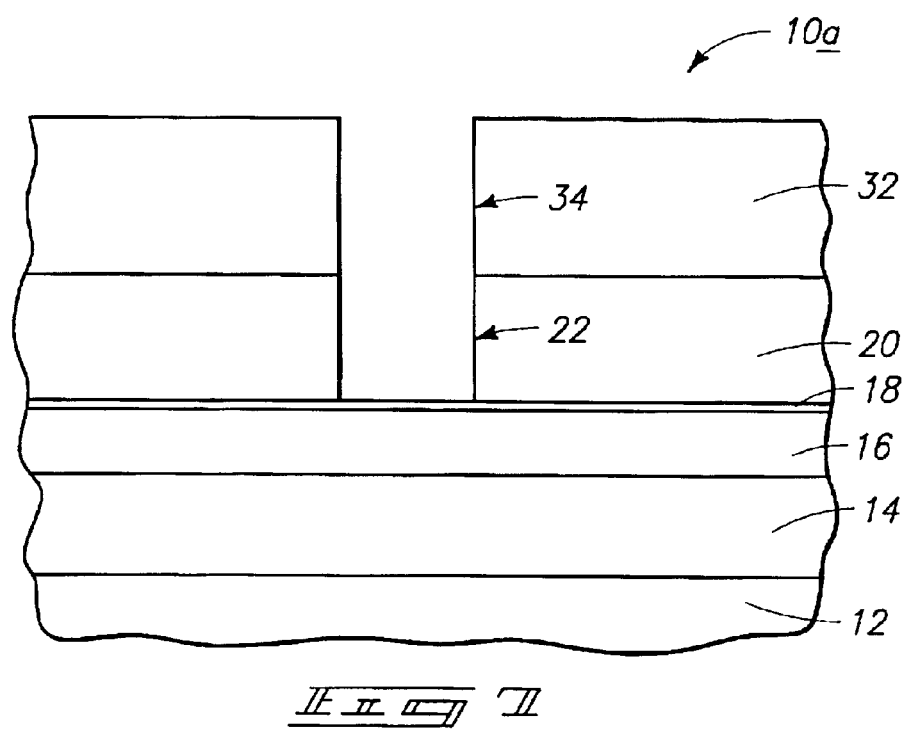
FIG. 7 is a view of the FIG. 6 wafer fragment at a processing step subsequent to that shown by FIG. 6.

Referring to FIG. 7, a contact opening 22 is etched into insulative material 20 through mask opening 34 to proximate silicon carbide comprising layer 18, and preferably all the way thereto as shown. The processing conditions and chemistry can be as described above.

Referring to FIG. 8, in a common etching step and with resist 32 being on the substrate, plasma etching is conducted within contact opening 22 through silicon carbide comprising layer 18 using a gas chemistry comprising oxygen and hydrogen to (a) extend contact opening 22 through the silicon carbide comprising layer, and under conditions which etch the silicon carbide comprising layer at a rate at least twice that of any etching of insulative material 20, and (b) plasma etch of all resist from the substrate occurs during such etching. The above-described exemplary chemistries and conditions provide but one example of processing which will remove both silicon carbide and resist, such as photoresist, from the substrate in a common etching step.

Referring to FIG. 9, conductive material 24 is provided within contact opening 22.

Figure 11:
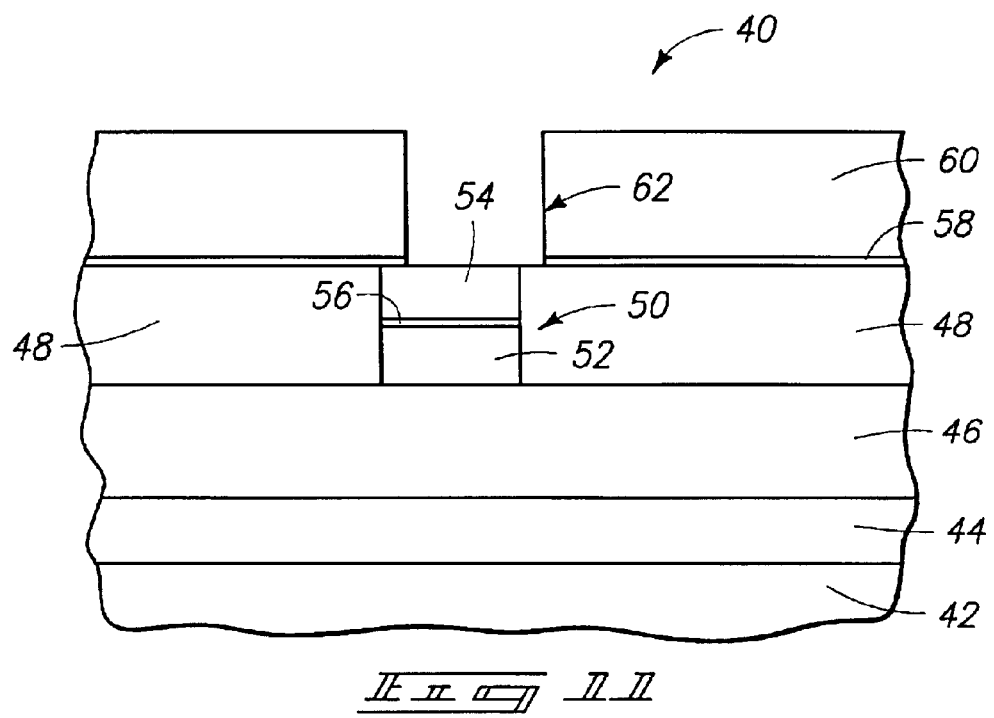
FIG. 11 is a view of the FIG. 10 wafer fragment at a processing step subsequent to that shown by FIG. 10.
Figure 12:
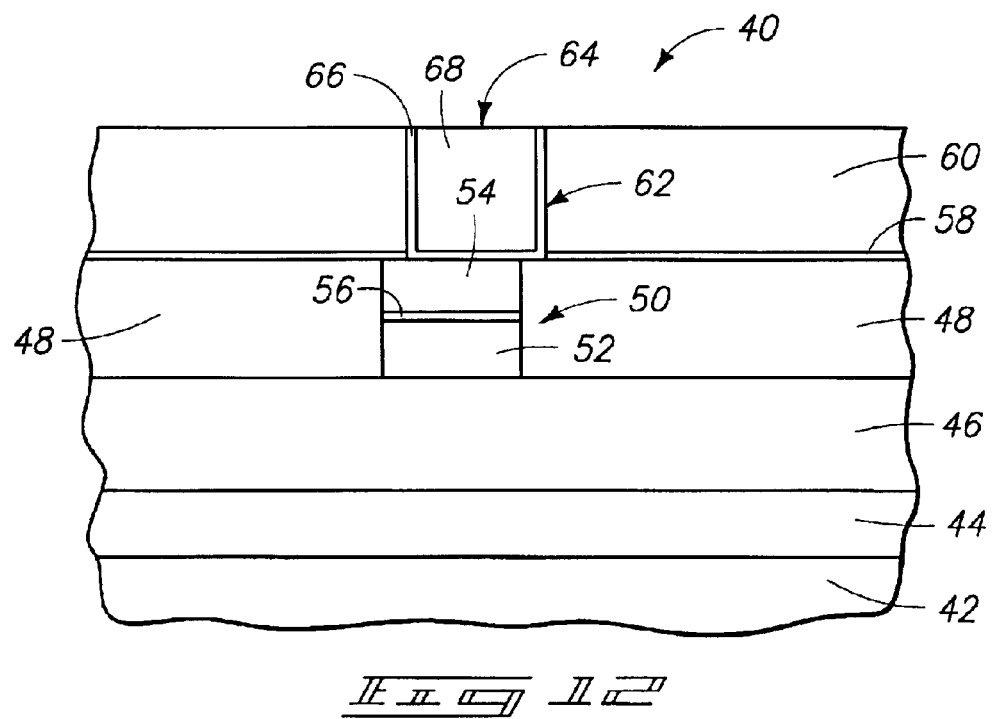
FIG. 12 is a view of the FIG. 11 wafer fragment at a processing step subsequent to that shown by FIG. 11.

A process of forming MRAM circuitry in accordance with an aspect of the invention is described by way of example only with respect to FIGS. 10–12. FIG. 10 depicts a wafer fragment 40 comprising a bulk monocrystalline silicon substrate 42. An insulative material 44, analogous to insulative material 14 of the first described embodiments, is formed over semiconductor substrate 42. A conductive layer 46, analogous to material 16 of the first described embodiments, is formed over insulative material 44. An insulative material layer 48 is formed over conductive layer 46. By way of example only, possible exemplary materials include the same as those described above for layers 14 and 20.

Substrate 40 comprises an MRAM cell 50, which comprises some magnetic material. Any possible MRAM cell is contemplated, whether existing or yet-to-be-developed. In the depicted exemplary embodiment, MRAM cell 50 comprises a non-magnetic layer 56 sandwiched between opposing magnetic material layers 52 and 54. Exemplary materials for magnetic layers 52 and 54 include a mixture of nickel, cobalt and iron, with an exemplary material for layer 56 being $Al_2O_3$.

A silicon carbide comprising layer 58 is chemical vapor deposited over the MRAM cell at a temperature of no greater than 500° C. Exemplary and preferred processing is as described above with respect to the formation of layer 18 in the first described embodiments. An insulative material 60 is formed over silicon carbide comprising layer 58. Exemplary preferred materials are as described above with respect to layer 20 in the first described embodiments.

A contact opening 62 is etched through insulative material 60 using silicon carbide comprising layer 58 as an etch stop. Exemplary and preferred processing is as described above with respect to contact opening 22 etching within material 20 in the first described embodiments.

Referring to FIG. 11, plasma etching is conducted within contact opening 62 through silicon carbide comprising layer 58 using a gas chemistry comprising oxygen and hydrogen to extend contact opening 62 through silicon carbide comprising layer 58 to magnetic material, for example magnetic material 54, of MRAM cell 50, and under conditions which etches silicon carbide comprising layer 58 at a rate at least twice that of any etching of insulative material 60. Again, exemplary and preferred processing conditions and chemistries are as described above with respect to the plasma etching of silicon carbide comprising layer 18 in the first described embodiments.

Referring to FIG. 12, conductive material 64, including a barrier layer 66 and another material 68, is formed within contact opening 62. Exemplary preferred materials are as described above with respect to material 24 in the first described embodiments.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming integrated circuitry, comprising:
chemical vapor depositing a silicon carbide comprising layer over a semiconductor substrate at a temperature of no greater than 500° C.; and
plasma etching through at least a portion of the silicon carbide comprising layer received over the semiconductor substrate using a gas chemistry comprising oxygen and hydrogen.

2. The method of claim 1 comprising conducting the chemical vapor depositing at a temperature of no greater than 200° C.

3. The method of claim 1 wherein the substrate is not exposed to a temperature greater than 500° C. between the depositing and the etching.

4. The method of claim 1 wherein the substrate is not exposed to a temperature greater than the highest temperature during the depositing between the depositing and the etching.

5. The method of claim 1 wherein the chemical vapor depositing is plasma enhanced.

6. Th method of claim 1 wher in the oxygen is derived from the group consisting of $O_2$, $O_3$, $NO_x$, $CO$, $CO_2$, and mixtur s thereof.

7. The method of claim 1 wherein the hydrogen is derived from the group consisting of $H_2$, $NH_3$, $CH_4$, and mixtures thereof.

8. The method of claim 1 wherein,
the oxygen is derived from the group consisting of $O_2$, $O_3$, $NO_x$, $CO$, $CO_2$, and mixtures thereof; and
the hydrogen is derived from the group consisting of $H_2$, $NH_3$, $CH_4$, and mixtures thereof.

9. The method of claim 1 wherein the oxygen is derived at least in part from $O_2$ and the hydrogen is derived at least in part from $NH_3$.

10. The method of claim 1 wherein the plasma etching is conducted within a chamber, plasma during the plasma etching being first formed within the chamber.

11. The method of claim 1 wherein the plasma etching is conducted within a chamber, plasma during the plasma etching being first formed remote from the chamber.

12. The method of claim 1 wherein the oxygen is derived from a gas comprising $O_2$.

13. The method of claim 1 wherein the oxygen is derived from a gas comprising $O_3$.

14. The method of claim 1 wherein the oxygen is derived from a gas comprising $NO_x$.

15. The method of claim 1 wher in the oxygen is derived from a gas comprising CO.

16. The method of claim 1 wherein the oxygen is derived from a gas comprising $CO_2$.

17. The method of claim 1 wherein the hydrogen is derived from a gas comprising $H_2$.

18. The method of claim 1 wherein the hydrogen is derived from a gas comprising $NH_3$.

19. The method of claim 1 wherein the hydrogen Is derived from a gas comprising $CH_4$.

20. A semiconductor processing method, comprising:
chemical vapor depositing a silicon carbide comprising layer over a semiconductor substrate at a temperature of no greater than 500° C.;
forming an insulative material over the silicon carbide comprising layer;
etching a contact opening into the insulative material to proximate the silicon carbide comprising layer; and
plasma etching within the contact opening through the silicon carbide comprising layer using a gas chemistry comprising oxygen and hydrogen to extend the contact opening through the silicon carbide comprising layer and under conditions which etches the silicon carbide comprising layer at a rate at least twice that of any etching of the insulative material.

21. The method of claim 20 comprising plasma etching under conditions which etch the silicon carbide comprising layer at a rate at least three times that of any etching of the insulative material.

22. The method of claim 20 comprising plasma etching under conditions which etch the silicon carbide comprising layer at a rate at least four times that of any etching of the insulative material.

23. The method of claim 20 wherein the etching to proximate the silicon carbid comprising layer xposes the silicon carbide comprising layer, and using the silicon carbide comprising layer as an etch stop during said etching to proximate the silicon carbide comprising layer.

24. The method of claim 20 comprising conducting the chemical vapor depositing at a temperature of no greater than 200° C.

25. The method of claim 20 wherein the substrate is not exposed to a temperature greater than 500° C. between the depositing and the etching.

26. The method of claim 20 wherein the substrate is not exposed to a temperature greater than the highest temperature during the depositing between the depositing and the etching.

27. The method of claim 20 comprising conducting the chemical vapor depositing at a temperature of no greater than 250° C. and wherein the substrate is not exposed to a temperature greater than 250° C. between the depositing and the etching.

28. The method of claim 20 wherein the oxygen is derived from the group consisting of $O_2$, $O_3$, $NO_x$, $CO$, $CO_2$, and mixtures thereof.

29. The method of claim 20 wherein the hydrogen is derived from the group consisting of $H_2$, $NH_3$, $CH_4$, and mixtures th reof.

30. The method of claim 20 wherein the oxygen is derived at least in part from $O_2$ and the hydrogen is derived at least in part from $NH_3$.

31. The method of claim 20 wherein the plasma etching is conducted within a chamber, plasma during the plasma etching being first formed within the chamber.

32. The method of claim 20 comprising after the plasma tching, forming conductive material within the contact opening.

33. The method of claim 20 wherein the plasma etching is conducted within a chamber, plasma during the plasma etching being first formed remote from the chamber.

34. The method of claim 20 wherein the insulative material comprises $SiO_2$.

35. The method of claim 20 wherein the oxygen is derived from a gas comprising $O_2$.

36. The method of claim 20 wherein the oxygen is derived from a gas comprising $O_3$.

37. The method of claim 20 wherein the oxygen is derived from a gas comprising $NO_x$.

38. The method of claim 20 wherein the oxygen is derived from a gas comprising CO.

39. The method of claim 20 wherein the oxygen is derived from a gas comprising $CO_2$.

40. The method of claim 20 wherein the hydrogen is derived from a gas comprising $H_2$.

41. The method of claim 20 wherein the hydrogen is derived from a gas comprising $NH_3$.

42. The method of claim 20 wherein the hydrogen is derived from a gas comprising $CH_4$.

43. A semiconductor processing method, comprising:
chemical vapor depositing a silicon carbide comprising layer over a semiconductor substrate at a temperature of no greater than 500° C.;
forming an insulative material over the silicon carbide comprising layer;
forming resist over the insulative material;
forming a mask opening within the resist to proximate the insulative layer;
etching a contact opening into the insulative material through the mask opening to proximate the silicon carbide comprising layer; and
with the resist on the substrate, a) plasma etching within the contact opening through the silicon carbide comprising layer using a gas chemistry comprising oxygen and hydrogen to extend the contact opening through the silicon carbide comprising layer and under conditions which etch the silicon carbide comprising layer at a rate at least twice that of any etching of the insulative material, and b) plasma etching all resist from the substrate, said plasma etching in "a)" and in "b)" being conducted in an etching step common to "a)" and "b)".

44. The method of claim 43 wherein the insulative material comprises $SiO_2$.

45. The method of claim 43 wherein the etching to proximate the silicon carbide comprising layer exposes the silicon carbide comprising layer, and using the silicon carbide comprising layer as an etch stop during said etching to proximate the silicon carbide comprising layer.

46. The method of claim 43 comprising conducting the chemical vapor depositing at a temperature of no greater than 200° C.

47. The method of claim 43 wherein the substrate is not xposed to a temperature greater than 500° C. between the depositing and the etching.

48. The method of claim 43 wherein the substrate is not xposed to a temperature greater than the highest temperature during the depositing between the depositing and the etching.

49. The method of claim 43 comprising conducting the chemical vapor depositing at a temperature of no greater than 250° C., and wherein the substrate is not exposed to a temperature greater than 250° C. between the depositing and the etching.

50. The method of claim 43 wherein the oxygen is derived from the group consisting of $O_2$, $O_3$, $NO_x$, CO, $CO_2$, and mixtures thereof.

51. The method of claim 43 wherein th hydrogen is derived from the group consisting of $H_2$, $NH_3$, $CH_4$, and mixtures thereof.

52. The method of claim 43 wherein the plasma etching is conducted within a chamber, plasma during the plasma etching being first formed within the chamber.

53. The method of claim 43 comprising after the plasma etching, forming conductive material within the contact opening.

54. The method of claim 43 wherein the resist comprises photoresist.

55. The method of claim 43 wherein the plasma etching is conducted within a chamb r, plasma during the plasma etching being first formed remote from the chamber.

56. The method of claim 43 comprising plasma etching under conditions which etch the silicon carbide comprising layer at a rate at least three times that of any etching of the insulative material.

57. The method of claim 43 comprising plasma etching under conditions which etch the silicon carbide comprising layer at a rate at least four times that of any etching of the insulative material.

58. The method of claim 43 wherein the oxygen is derived from a gas comprising $O_2$.

59. The method of claim 43 wherein the oxygen is derived from a gas comprising $O_3$.

60. The method of claim 43 wherein the oxygen is derived from a gas comprising $NO_x$.

61. The method of claim 43 wherein the oxygen is derived from a gas comprising CO.

62. The method of claim 43 wherein the oxygen is derived from a gas comprising $CO_2$.

63. The method of claim 43 wherein the hydrogen is derived from a gas comprising $H_2$.

64. The method of claim 43 wherein the hydrogen is derived from a gas comprising $NH_3$.

65. The method of claim 43 wherein the hydrogen is derived from a gas comprising $CH_4$.

* * * * *

UNITED STATES PATENT AND TRADEMARK OFFICE
CERTIFICATE OF CORRECTION

PATENT NO. : 6,797,628 B2
DATED : September 28, 2004
INVENTOR(S) : Li et al.

It is certified that error appears in the above-identified patent and that said Letters Patent is hereby corrected as shown below:

Column 7,
Line 25, please delete "Th method of claim 1 wher in" before "the" and insert -- The method of claim 1 wherein --.
Line 27, please delete "mixture s" before "thereof" and insert -- mixtures --.
Line 52, please delete "wher in" after "claim 1" and insert -- wherein --.

Column 8,
Line 19, please delete "xposes" after "layer" and insert -- exposes --.
Line 43, please delete "th reof" after "mixtures" and insert -- thereof --.

Column 9,
Lines 40 and 44, please delete "xposed" before "to a" and insert -- exposed --.

Column 10,
Line 7, please delete "th" after "wherein" and insert -- the --.
Line 20, please delete "chamb r" after "within a" and insert -- chamber --.

Signed and Sealed this

Nineteenth Day of July, 2005

JON W. DUDAS
*Director of the United States Patent and Trademark Office*